(12) United States Patent
Cheng et al.

(10) Patent No.: US 9,337,281 B2
(45) Date of Patent: May 10, 2016

(54) PLANAR SEMICONDUCTOR GROWTH ON III-V MATERIAL

(71) Applicant: GLOBALFOUNDRIES INC., Grand Cayman (KY)

(72) Inventors: Cheng-Wei Cheng, White Plains, NY (US); Jack O. Chu, Manhasset Hills, NY (US); Devendra K. Sadana, Pleasantville, NY (US); Kuen-Ting Shiu, White Plains, NY (US); Yanning Sun, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/803,910

(22) Filed: Jul. 20, 2015

(65) Prior Publication Data
US 2015/0325682 A1    Nov. 12, 2015

Related U.S. Application Data

(62) Division of application No. 13/760,277, filed on Feb. 6, 2013, now Pat. No. 9,087,775.

(51) Int. Cl.
| | |
|---|---|
| *H01L 21/336* | (2006.01) |
| *H01L 29/267* | (2006.01) |
| *H01L 29/772* | (2006.01) |
| *H01L 29/45* | (2006.01) |
| *H01L 21/02* | (2006.01) |
| *H01L 21/285* | (2006.01) |
| *H01L 21/322* | (2006.01) |
| *H01L 29/66* | (2006.01) |
| *H01L 29/78* | (2006.01) |

(52) U.S. Cl.
CPC .......... *H01L 29/267* (2013.01); *H01L 21/0262* (2013.01); *H01L 21/02387* (2013.01); *H01L 21/02439* (2013.01); *H01L 21/02532* (2013.01); *H01L 21/02538* (2013.01); *H01L 21/02661* (2013.01); *H01L 21/02664* (2013.01); *H01L 21/28575* (2013.01); *H01L 21/3228* (2013.01); *H01L 29/452* (2013.01); *H01L 29/66522* (2013.01); *H01L 29/772* (2013.01); *H01L 29/78* (2013.01)

(58) Field of Classification Search
CPC ................. H01L 29/66636; H01L 29/0847; H01L 29/267
USPC ............. 257/192, 289, 408; 117/95; 438/151, 438/285, 300
See application file for complete search history.

(56) References Cited

U.S. PATENT DOCUMENTS

| | | | | |
|---|---|---|---|---|
| 2006/0019466 A1* | 1/2006 | Nayfeh | ............. | H01L 21/02381 438/458 |
| 2010/0327317 A1* | 12/2010 | Pillarisetty | ........ | H01L 29/78684 257/192 |
| 2012/0205715 A1* | 8/2012 | Kwok | ................. | H01L 29/0847 257/190 |

OTHER PUBLICATIONS

Tang, S., et al. "High Quality Ge Thin Film Grown by Ultrahigh Vaccum Chemical Vapor Deposition on GAAS Substrate" Applied Physics Letters, vol. 98. Apr. 2011. pp. 2-3.

*Primary Examiner* — Zandra Smith
*Assistant Examiner* — John M Parker
(74) *Attorney, Agent, or Firm* — Yuanmin Cai; Hoffman Warnick LLC

(57) ABSTRACT

A semiconductor structure includes a III-V monocrystalline layer and a germanium surface layer. An interlayer is formed directly between the III-V monocrystalline layer and the germanium surface layer from a material selected to provide stronger nucleation bonding between the interlayer and the germanium surface layer than nucleation bonding that would be achievable directly between the III-V monocrystalline layer and the germanium surface layer such that a continuous, relatively defect-free germanium surface layer is provided.

20 Claims, 5 Drawing Sheets

PLANAR SEMICONDUCTOR GROWTH ON III-V MATERIAL

RELATED APPLICATION DATA

This application is a Divisional application of co-pending U.S. patent application Ser. No. 13/760,277 filed on Feb. 6, 2013, incorporated herein by reference in its entirety.

BACKGROUND

1. Technical Field

The present invention relates to semiconductor devices and processing, and more particularly to high quality planar semiconductor growth on III-V materials.

2. Description of the Related Art

In many applications in the semiconductor industry, it is advantageous to grow crystalline materials on monocrystalline substrates. In one example, planar germanium (Ge) films need to be formed on an InGaAs substrate. However, this is very difficult due to the existence of residual As atoms and native oxides on the surface of the substrate. The resulting grown Ge film is not continuous. Deep pits form in the substrate leading to non-uniform Ge growth.

In an attempt to grow a more uniform and continuous Ge film, high temperature baking prior to the Ge growth has been employed. While such techniques clean native oxide and perhaps residual atoms on the substrate surface, these methods have proven to be insufficient at growing continuous and acceptable Ge films on GaAs substrates due at least to the weak Ge bonding at the nucleation stage.

SUMMARY

A semiconductor structure includes a III-V monocrystalline layer and a crystalline germanium surface layer. An interlayer is formed directly between the III-V monocrystalline layer and the germanium surface layer from a material selected to provide stronger nucleation bonding between the interlayer and the germanium surface layer than nucleation bonding that would be achievable directly between the III-V monocrystalline layer and the germanium surface layer such that a continuous, relatively defect-free germanium surface layer is provided.

Another semiconductor structure includes a substrate layer, a III-V monocrystalline layer formed on the substrate layer; and an interlayer formed directly on the III-V monocrystalline layer in regions where germanium is to be grown. The interlayer is formed from a material selected to provide stronger nucleation bonding between the interlayer and the germanium than nucleation bonding that would be achievable directly between the III-V monocrystalline layer and the germanium formed directly on the interlayer in the regions. A doped crystalline germanium surface layer is formed on the regions such that a continuous, relatively defect-free germanium conductive structure is provided.

A method for fabricating a semiconductor structure includes removing impurities from a III-V monocrystalline layer; forming an interlayer directly on the III-V monocrystalline layer from a material selected to provide stronger nucleation bonding between the interlayer and a germanium surface layer than nucleation bonding that would be achievable directly between the III-V monocrystalline layer and the germanium surface layer; and growing a crystalline germanium surface layer directly on the interlayer such that a continuous, relatively defect-free germanium surface layer is provided.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
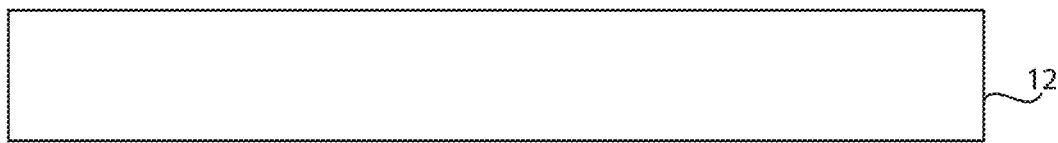
FIG. 1 is a cross-sectional view of a III-V substrate or layer subjected to a heat treatment in accordance with the present principles.

In accordance with the present principles, methods and devices are provided that include an interlayer between a III-V substrate or layer and a grown germanium layer. The interlayer is extremely thin and is provided to prevent direct formation of the Ge layer on the III-V material. The interlayer provides strong bonding with both the Ge layer and the III-V material. This results in a continuous, smooth and uniform Ge layer.

The interlayer is formed directly between the III-V layer and the germanium surface layer from a material selected to provide stronger nucleation bonding between the interlayer and the germanium surface layer than nucleation bonding that would be achievable directly between the III-V layer and the germanium surface layer. The interlayer may include one or more monolayers of GaAs, P, Si, or other materials. The interlayer may be employed in any semiconductor device and processing technique to increase the quality of a grown Ge layer. For example, the interlayer may be employed in transistor devices, diodes, heterojunction devices, photovoltaic devices, etc.

It is to be understood that the present invention will be described in terms of a given illustrative architecture having a III-V substrate or wafer with an interlayer and a germanium layer formed thereon; however, other architectures, structures, substrate materials and process features and steps may be varied within the scope of the present invention. For example, the interlayer may include multiple layers and the germanium may include alloys of germanium (e.g., SiGe, etc.).

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present principles may be employed in integrated circuit chips. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs or SiGe. These compounds include different proportions of the elements within the compound, e.g., InGaAs includes $In_xGa_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
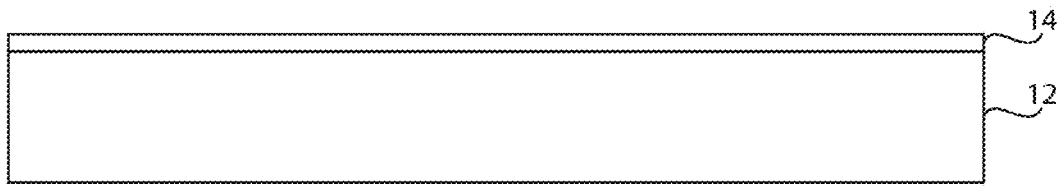
FIG. 2 is a cross-sectional view of the III-V substrate or layer having an interlayer formed thereon and subjected to a heat treatment in accordance with the present principles.
Figure 3:
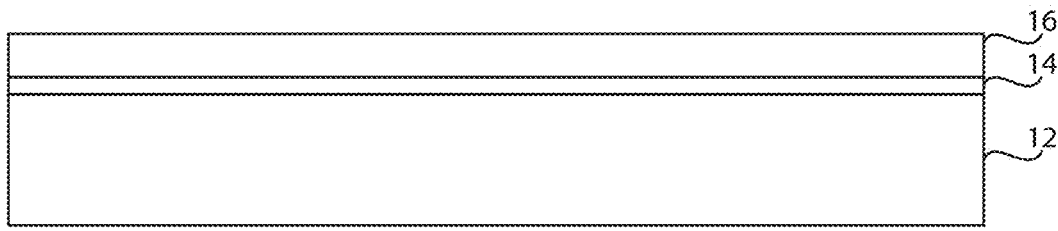
FIG. 3 is a cross-sectional view showing a germanium layer formed on the interlayer in accordance with the present principles.

Referring now to the drawings in which like numerals represent the same or similar elements and initially to FIGS. 1-3, an illustrative process is shown for forming a germanium containing layer on a III-V material in accordance with one embodiment. This process may be incorporated into any semiconductor fabrication method to grow Ge on a III-V substrate.

Referring to FIG. 1, a III-V substrate 12 is provided. In accordance with one embodiment, the III-V substrate includes GaAs, InGaAs, AlGaAs, AlInGaAs, InP, GaP, GaInP, GaN, GaSb or any other III-V substrate or layer. The III-V substrate 12 preferably includes a monocrystalline structure suitable for crystalline growth of subsequent layers thereon. A high temperature bake process may be employed to drive off/desorb or reduce native oxides and to reduce surface impurities on the substrate or layer 12. The baking process may include temperatures of between about 500-800 degrees C. The baking process may optionally include a reactive gas such as arsine ($AsH_3$) or other reactive gases depending on the impurities that are to be reduced or eliminated.

Referring to FIG. 2, an interlayer 14 is formed after a high temperature bake process. The interlayer 14 is preferably grown using an epitaxial growth process. Atomic layer deposition, molecular beam epitaxy, plasma enhanced chemical vapor deposition and other processes may be suitable for interlayer growth. The interlayer 14 need only be a one to a few atoms thick. In particularly useful devices, the interlayer 14 includes a monolayer to about 20 nm in thickness. Depending on the substrate material, the interlayer 14 may include phosphorus, arsenic, gallium, gallium arsenide, silicon, silicon germanium or other materials that provide a surface suitable for forming a continuous surface layer thereon.

A high temperature baking process and/or a chemical flow process may be performed. The baking and/or flow processes are provided to remove residual atoms generally or of a particular species from a surface of the interlayer 14. The baking process may include temperatures of between about 500-800 degrees C. For example, if the interlayer 14 includes GaAs, then the flow may include Trimethyl Gallium (TMG) to remove residual As atoms. Other flow gases are also contemplated for other interlayer 14 materials, e.g., $SiH_6$, etc.

Referring to FIG. 3, a surface layer 16 is grown from the interlayer 14. The interlayer 14 assists in the nucleation of the surface layer 16 to avoid the formation of pits or discontinuities in the surface layer 16. The surface layer 16 may include a plurality of different materials; however, since Ge on III-V materials is particularly difficult, a particularly useful embodiment preferably includes Ge or SiGe as the surface layer 16. The surface layer 16 includes a crystalline structure that is preferably epitaxially grown. Atomic layer deposition, molecular beam epitaxy, plasma enhanced chemical vapor deposition and other processes may be suitable for growth of the surface layer 16.

Figure 4:
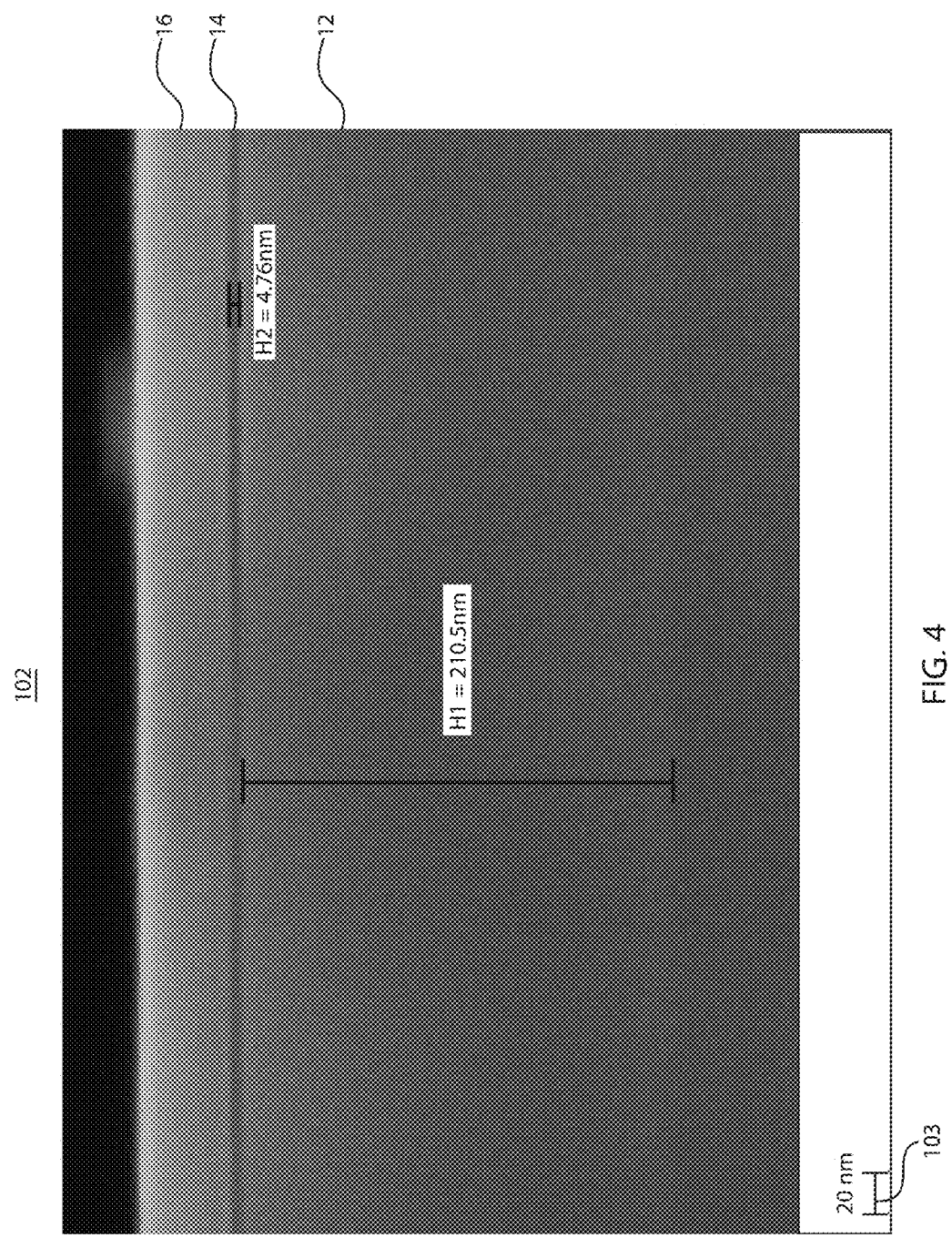
FIG. 4 is a scanning electron microscope (SEM) image showing an InGaAs substrate, a GaAs interlayer and a smooth continuous Ge surface layer in accordance with the present principles.

Referring to FIG. 4, a scanning electron microscope (SEM) image 102 shows the substrate 12 including InGaAs, the interlayer 14 including GaAs, and the surface layer 16 including Ge. The substrate 12 includes a thickness H1=210.5 nm and the interlayer 14 includes a thickness H2=4.76 nm (shown for illustrative purposes). A scale 103 of 20 nm is also shown. In accordance with the present principles, a high quality, continuous Ge layer 16 resulted using the following process steps. A native oxide clean was performed on the InGaAs substrate at a temperature range of between about 600 and 700 degrees C. and preferably about 650 degrees C. for about 2 minutes. A reactive gas, such as, e.g., arsine gas, was provided as well to further remove impurities from the InGaAs surface. A GaAs interlayer was formed on the InGaAs substrate. The GaAs interlayer had a thickness of less than about 5 nm and in one particular embodiment was about 4 nm. Then, the GaAs interlayer was treated by baking with a temperature range of between 450 and 600 degrees C., and in particular about 550 degrees C. A TMG flow was also optionally employed for about 5 minutes. The Ge surface layer 16 was epitaxially grown using $GeH_4$ at a partial pressure of about 140 mT. It should be understood that the partial pressure may range from about 50 mT to about 250 mT. The deposition temperature may range from about 375 degrees C. to about 500 degrees C., with 400-425 degrees C. being preferable.

At these conditions, deposition times of between about 300 seconds to about 600 seconds for a PECVD process were employed to grow the Ge surface layer 16. In a particularly useful embodiment, a pristine Ge surface layer 16 was achieved by a PECVD process at 400 degrees C. for 500 seconds at a partial pressure of 140 mT. The interlayer 14 with the surface layer 16 formed thereon may be employed in many semiconductor structures. One illustrative example will be described with reference to FIGS. 5-8, which shows a III-V metal oxide semiconductor field effect transistor (MOSFET) incorporating the present teachings. Other structures and processes may benefit from the present principles as well.

One aim is to provide a continuous Ge layer over a III-V material. Defect free layers are difficult to achieve; however, in accordance with the present principles, a defect density of less than $10^9/cm^2$ is repeatably achievable. The root-mean square roughness of Ge layer will be between 0.5 nm and 5 nm. The density of pits is below $10^5/cm^2$.

Figure 5:
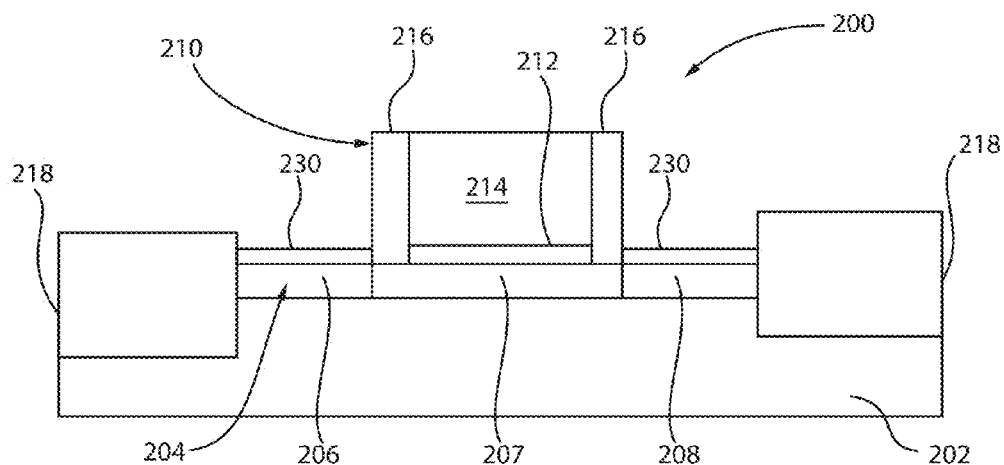
FIG. 5 is a cross-sectional view showing a metal oxide semiconductor field effect transistor (MOSFET) device formed with an interlayer in accordance with the present principles.

Referring to FIG. 5, a MOSFET device 200 includes a substrate 202, which includes a III-V material, such as, e.g., InP or other material. The substrate 202 is preferably a monocrystalline structure, having shallow trench isolation structures 218, formed therein from, e.g., oxide. A semiconductor layer 204 is grown on or wafer bonded to the substrate 202. The semiconductor layer 204 includes a crystalline semiconductor material such as, e.g., InGaAs or other III-V material.

An interlayer 230 is formed on semiconductor layer 204 using a process, e.g., as described above. Processing may include a bake of the semiconductor layer 204 to remove native oxide and other impurities. A wet etch or other chemical treatment may be employed to clean the semiconductor layer 204 as well as or instead of the bake. The cleaning process is followed by the deposition (growth) of the interlayer 230. The interlayer 230 may include P, As, GaAs, Si, etc. Upon formation of the interlayer 230 another bake process may be employed to prepare the interlayer 230 to receive a surface layer as will be described in FIG. 6.

Next, a gate stack 210 is formed having a gate dielectric 212, which may include a high dielectric (high-K) material such as $HfO_2$ or the like. A gate conductor 214 is formed over the gate dielectric 212 and may include a conductive material, such as TiN or other known gate conductor material or materials. The gate dielectric 212 and the gate conductor 214 are formed as layers and patterned on the semiconductor layer 204. Then, spacers 216 are deposited and etched on sides of the gate stack 210. Trenches are formed through the semiconductor layer 204 and into the substrate 202 and filled with a dielectric material (e.g., oxide) to form shallow trench isolation (STI) regions 218. The oxide of STI regions 218 extends above the semiconductor layer 204. This provides for the possibility of employing a self-aligned doping process for forming a source region 206 and a drain region 208. A channel region 207 is disposed between the source region 206 and drain region 208.

The source and drain (S/D) regions 206 and 208 may be doped in-situ, by diffusion, by implantation or a combination of these. These processes are performed relative to the STI regions 218 and the gate stack 210. The interlayer 230 may be formed prior to forming the gate stack 210 and doping the S/D regions 206, 208 or after the formation of the gates stack 210 and doping of the S/D regions 206, 208.

Figure 6:
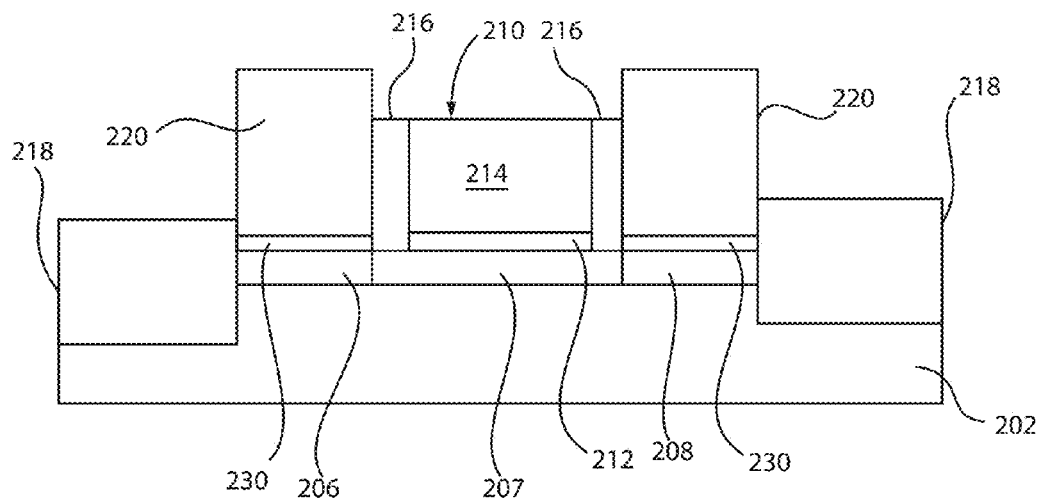
FIG. 6 is a cross-sectional view showing the MOSFET device of FIG. 5 with a surface layer (contacts) formed on the interlayer in accordance with the present principles.

Referring to FIG. 6, a surface layer(s) 220 (contacts or S/D extensions) are grown from the interlayer 230. The surface layer 220 is selectively grown on interlayer 230 and self-aligned with the S/D regions 206, 208. The surface layer 220 includes a doped Ge. The Ge of the surface layer 220 may include n+ Ge and be doped in-situ during formation. Prior to formation or growth of the surface layer 220, another bake process may be performed to remove impurities and oxides from the interlayer 230. In the present example, the surface layer 220 is grown to form S/D extension regions or to form S/D contacts. The surface layer 220 is grown to provide a "silicide-like" contact interface to the S/D regions 206 and 208. Since the nucleation stage for germanium growth is relatively free from defects, the crystal nature on the surface layer 220 will be of high quality and provide better conductivity.

Figure 7:
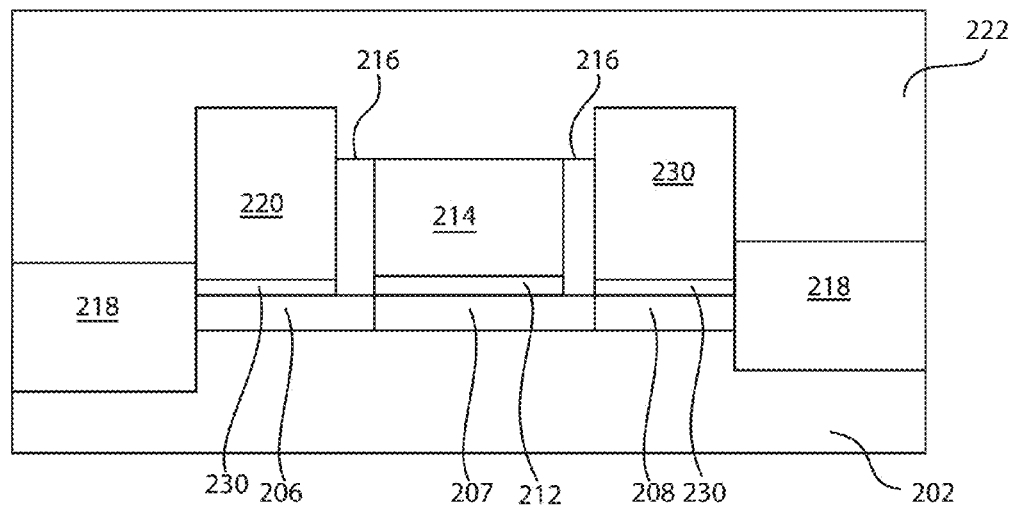
FIG. 7 is a cross-sectional view showing the MOSFET device of FIG. 6 with a conductor formed over the surface layer in accordance with the present principles.
Figure 8:
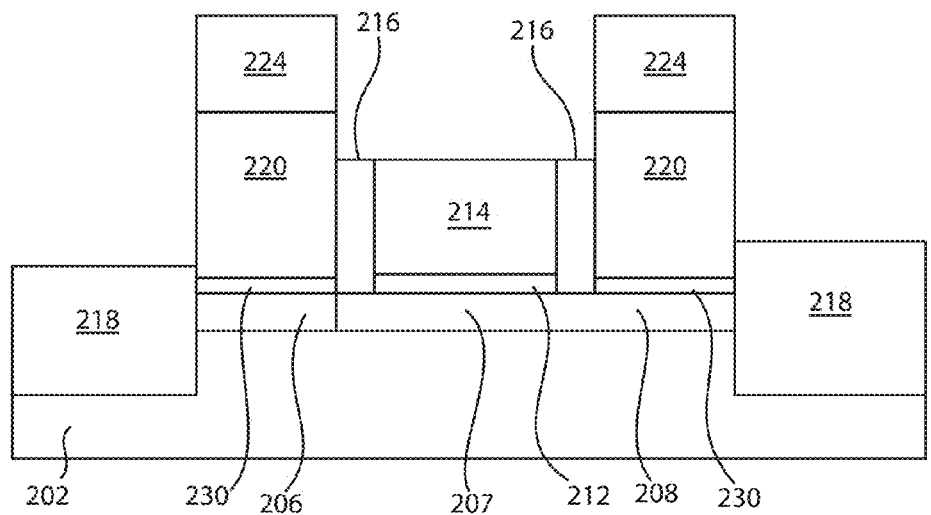
FIG. 8 is a cross-sectional view showing the MOSFET device of FIG. 7 with the conductor patterned to form metal structures in accordance with the present principles.

Referring to FIGS. 7 and 8, a conductor 222 is deposited over the MOSFET device 200 and the contacts 220 (surface layer). In one embodiment, the conductor 222 includes Ni or an alloy thereof. Other embodiments may employ other conductive materials. The conductor 222 is then patterned to form metal structures 224. The metal structures 224 may be doped with Ge, or Ge may diffuse into the metal structures 224, e.g., to form NiGe. In some embodiments, the metal structures 224 may include metal lines or may include metal contacts to S/D extensions. Processing continues to form interlevel dielectric layers, metal layers, packaging structures, etc. It should be understood that the structures described are for illustrative purposes and that the present principles may be applied to any semiconductor structure or process.

Figure 9:
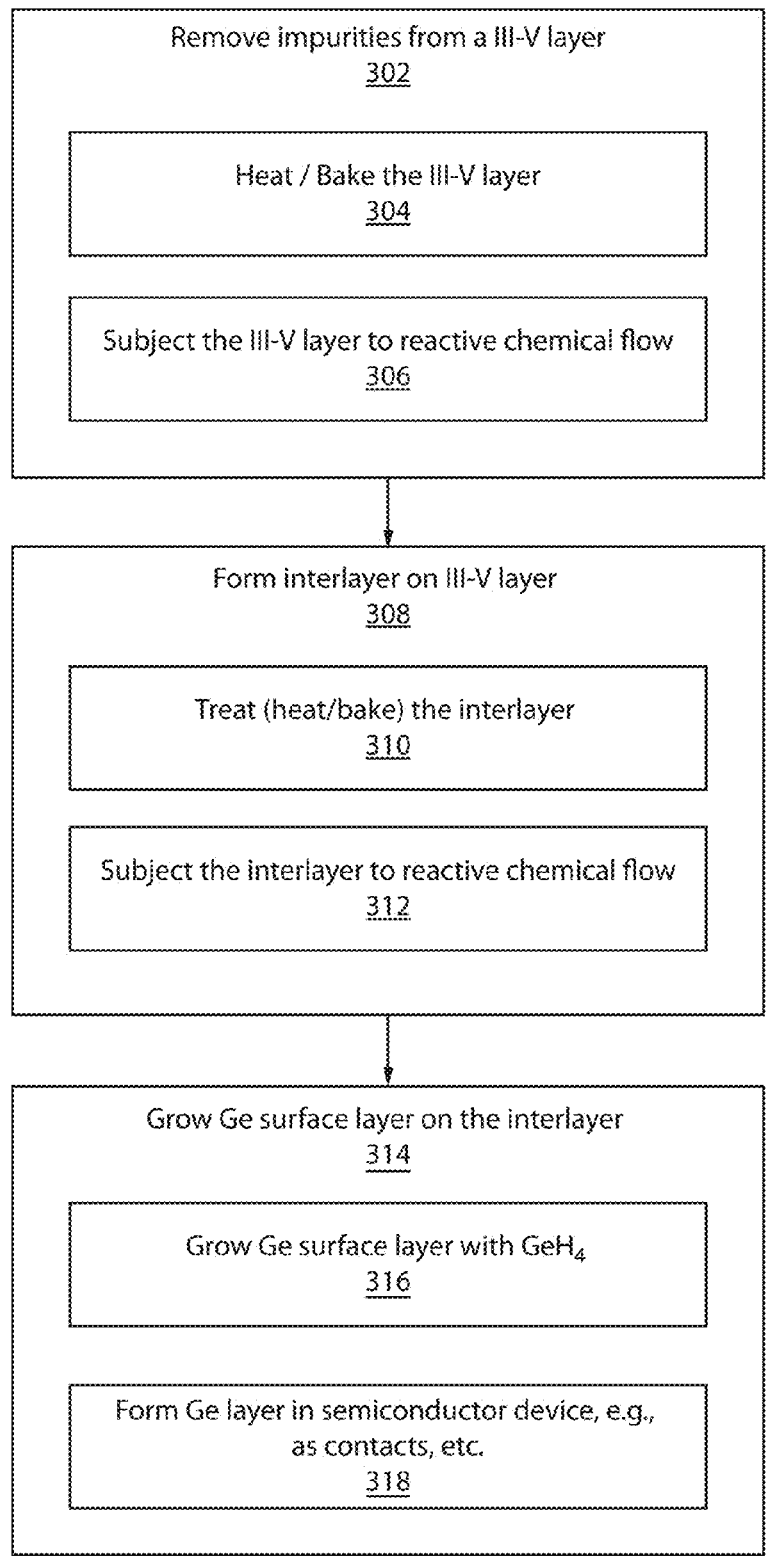
FIG. 9 is a block/flow diagram showing a method for growing Ge over III-V substrates in accordance with illustrative embodiments.

Referring to FIG. 9, a method for fabricating semiconductor structures are illustrative shown. The flowchart and block diagrams in the FIG. 9 illustrate the functionality, and operation of possible implementations of methods according to various embodiments of the present invention. It should also be noted that, in some alternative implementations, the functions noted in the blocks may occur out of the order noted in FIG. 9 or other FIGs. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, impurities are removed from a III-V monocrystalline layer. The III-V monocrystalline layer may include one of GaAs, InP, GaP, GaN, GaSb, etc. or alloys thereof. In block 304, this includes a heating or baking process to drive off native oxides and impurities (e.g., As or other materials). The baking process may be performed at a temperature of between 500 and 800 degrees C., preferably around 650 degrees C. for about 2 minutes. Etching processes may be employed as well. In block 306, during baking the III-V monocrystalline layer may be subject to a reactive chemical flow, e.g., arsine gas or the like.

In block 308, an interlayer is formed directly on the III-V monocrystalline layer from a material selected to provide stronger nucleation bonding between the interlayer and a germanium surface layer than nucleation bonding that would be achievable directly between the III-V monocrystalline layer and the germanium surface layer. The interlayer may include one of P, As, Ga, Si or combinations thereof. The interlayer may include a thickness of less than about 20 nm, and more preferably less than or equal to 5 nm.

In block 310, the interlayer may be treated before forming a germanium surface layer by baking the interlayer layer at a temperature of between 450 and 800 degrees C. In block 312, the interlayer layer may be subjected to a reactive chemical flow to remove impurities. The reactive chemical flow may include TMG, $Si_2H_6$, or other suitable gases.

In block 314, the germanium surface layer is grown directly on the interlayer such that a continuous and relatively defect free germanium surface layer is provided. In conventional processes, the lack of strong nucleation bonding between, e.g., InGaAs and Ge resulted in poor quality Ge films. Heat treating the InGaAs was insufficient to achieve the smoothness and continuity that is desirable in such a film. Providing an interlayer has been shown by the inventors to have overcome this obstacle, and continuous, high quality Ge films can be formed over III-V layers. The germanium surface layer may include a defect density of less than $10^9/cm^2$.

In block 316, growing the germanium surface layer may include depositing the germanium surface layer with $GeH_4$ at a temperature between 400 and 425 degrees C. at a pressure of between about 50 mT and 250 mT for about 400-600 seconds.

In one embodiment, a semiconductor structure includes a transistor device with source and drain regions of the transistor formed in the III-V monocrystalline layer. In block 318, the germanium surface layer is formed directly on the interlayer as contacts to or portions of the source and drain regions. The germanium surface layer may be doped, e.g., n+ doped. Processing may continue to form the semiconductor structure, e.g., a transistor or the like.

Having described preferred embodiments for planar semiconductor growth on III-V material (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor structure, comprising:
    forming a doped source and drain region for a device from a III-V monocrystalline layer, wherein a semiconductor substrate is positioned beneath the III-V monocrystalline layer;
    simultaneously removing impurities from the III-V monocrystalline layer and the semiconductor substrate;
    forming an interlayer directly on the III-V monocrystalline layer over the source and drain regions from a material;
    growing a crystalline germanium surface layer directly on the interlayer to form a source and drain extension for the respective source and drain regions of the device, such that a continuous, relatively defect-free germanium surface layer is provided; and
    forming a gate stack on the III-V monocrystalline layer after the simultaneously removing of impurities from the III-V monocrystalline layer and the semiconductor substrate.

2. The method as recited in claim 1, wherein removing impurities includes baking the III-V monocrystalline layer at a temperature of between 500 and 800 degrees C.

3. The method as recited in claim 2, wherein baking includes subjecting the III-V monocrystalline layer to a reactive chemical flow.

4. The method as recited in claim 1, further comprising treating the interlayer before forming the germanium surface layer by baking the interlayer layer at a temperature of between 450 and 600 degrees C.

5. The method as recited in claim 4, wherein baking the interlayer layer includes subjecting the interlayer layer to a reactive chemical flow to remove impurities.

6. The method as recited in claim 1, wherein growing the germanium surface layer includes depositing the germanium surface layer with GeH4 at a temperature between 400 and 425 degrees C., at a pressure of between about 50 mT and 250 mT.

7. The method as recited in claim 1, wherein the III-V monocrystalline layer includes one of GaAs, InP, GaP, GaN, GaSb and alloys thereof and the interlayer includes one of P, As, Ga, Si or combinations thereof.

8. The method as recited in claim 1, wherein forming the interlayer includes forming a thickness of less than a bout 20 nm.

9. The method as recited in claim 1, wherein the germanium surface layer includes a defect density of less than $10^9/cm^2$.

10. The method as recited in claim 1, wherein the semiconductor structure includes a transistor device, the III-V monocrystalline layer forms source and drain regions of the transistor and growing the germanium surface layer directly on the interlayer includes forming contacts to the source and drain regions.

11. The method as recited in claim 1, wherein a nucleation bonding strength between the interlayer and the III-V monocrystalline layer is greater than a nucleation bonding strength between the crystalline germanium surface layer and the III-V monocrystalline layer.

12. The method as recited in claim 1, wherein forming the interlayer directly on the III-V monocrystalline layer forms a planar interface between the interlayer and the III-V monocrystalline layer.

13. The method as recited in claim 1, wherein the relatively defect-free germanium surface layer is physically isolated from the III-V monocrystalline layer.

14. The method as recited in claim 1, wherein the removing impurities from the III-V monocrystalline layer reduces a concentration of impurities in the III-V monocrystalline layer.

15. The method as recited in claim 1, wherein the germanium surface layer includes a root-mean square roughness of between approximately 0.5 nanometers (nm) and approximately 5.0 nm.

16. The method as recited in claim 1, further comprising forming the III-V monocrystalline layer on the semiconductor substrate, before the forming of the doped source and drain region.

17. The method as recited in claim 16, wherein the forming of the III-V monocrystalline layer on the semiconductor substrate includes wafer bonding the III-V monocrystalline layer to the substrate.

18. The method as recited in claim 1, further comprising forming a transistor gate on the III-V monocrystalline layer after the forming of the interlayer.

19. The method as recited in claim 1, wherein the removing the impurities from the III-V monocrystalline layer includes removing native oxide compounds from the III-V monocrystalline layer.

20. A method for fabricating a semiconductor structure, comprising:
- forming a doped source and drain region for a device from a III-V monocrystalline layer positioned on a semiconductor substrate, the doped source and drain region including a planar upper surface;
- simultaneously removing impurities from the III-V monocrystalline layer and the semiconductor substrate to reduce a concentration of impurities in the III-V monocrystalline layer;
- forming an interlayer directly on the planar upper surface of the III-V monocrystalline layer over the source and drain regions from a material;
- growing a crystalline germanium surface layer directly on the interlayer to form a source and drain extension for the respective source and drain regions of the device, such that a continuous, relatively defect-free germanium surface layer is provided, wherein a nucleation bonding strength between the interlayer and the III-V monocrystalline layer is greater than a nucleation bonding strength between the crystalline germanium surface layer and the III-V monocrystalline layer; and
- forming a gate stack on the III-V monocrystalline layer after the simultaneously removing of impurities from the III-V monocrystalline layer and the semiconductor substrate.

* * * * *